United States Patent [19]
Moline

[11] 3,790,412
[45] Feb. 5, 1974

[54] METHOD OF REDUCING THE EFFECTS OF PARTICLE IMPINGEMENT ON SHADOW MASKS

[75] Inventor: Robert Alan Moline, Gillette, N.J.

[73] Assignee: Bell Telephone Laboratories, Incorporated, Murray Hill, N.J.

[22] Filed: Apr. 7, 1972

[21] Appl. No.: 242,124

[52] U.S. Cl. ................ 148/1.5, 29/579, 250/217 R, 250/492, 353/53
[51] Int. Cl. ................................................ H01l 7/54
[58] Field of Search 148/1.5 CP; 29/579; 250/217 R, 250/492; 353/53

[56] References Cited

UNITED STATES PATENTS

| | | | |
|---|---|---|---|
| 2,695,852 | 11/1954 | Sparks | 29/579 X |
| 2,933,979 | 4/1960 | Lacoe, Jr. | 353/53 |
| 2,949,815 | 4/1960 | Rosenberger et al. | 353/53 |
| 3,113,896 | 12/1963 | Mann | 29/579 X |
| 3,501,342 | 3/1970 | Haberecht et al. | 148/1.5 X |
| 3,713,922 | 1/1973 | Lepselter et al. | 148/1.5 UX |

*Primary Examiner*—L. Dewayne Rutledge
*Assistant Examiner*—J. M. David
*Attorney, Agent, or Firm*—R. B. Anderson

[57] ABSTRACT

Thermal expansion of shadow masks used in ion implantation processes has been found to cause inaccuracies in the ion implanted pattern. Such inaccuracies are reduced or eliminated by first directing a heating current into the mask, monitoring the resistance of the mask, and controlling the heating current in accordance with monitored resistance. As the mask is bombarded with ions, any temperature rise increases the monitored resistance to automatically reduce the heating current, thus compensating for the thermal effect of ion bombardment.

7 Claims, 2 Drawing Figures

METHOD OF REDUCING THE EFFECTS OF PARTICLE IMPINGEMENT ON SHADOW MASKS

BACKGROUND OF THE INVENTION

This invention relates to masking techniques, and more particularly to methods for masking the ion beam used in ion implantation processes.

An important part of the fabrication of semiconductor integrated circuits is the controlled introduction of impurities into a semiconductor wafer or substrate such as silicon. One method of introducing these impurities, or "doping" the substrate, in the particular circuit pattern desired, is to project a beam of ions of the impurity through apertures in a mask such that those ions projected through the mask penetrate the semiconductor substrate. This well-known process is known as ion implantation. If the mask is out of contact with the substrate, it is known as a shadow mask.

Although ion implantation is not at present the most widespread technique for doping semiconductor wafers, it is becoming increasingly favored in the fabrication of complex integrated circuits having extremely small components because of the high accuracy or resolution obtainable by ion implantation. Because miniaturization is of paramount importance in increasing the speed capabilities, reducing power consumption, and reducing the physical size of complex electronic systems using integrated circuits, considerable effort has been made to increase further the accuracy and resolution with which ion implanted regions may be defined.

In my study of this general problem, I have found that resolution and accuracy are seriously limited by the effects of thermal expansion of the mask due to ion bombardment. This is particularly true if the mask is a shadow mask because of the relatively poor heat dissipation from it. I have further ascertained that these effects can only be partially alleviated by efficient heat sinking of the mask because of unavoidable temperature gradients and temperature changes that will occur even with the most efficient heat sinking.

SUMMARY OF THE INVENTION

Accordingly, it is an object of this invention to increase the accuracy and resolution with which ion implanted circuit patterns may be defined.

It is another object of this invention to reduce or eliminate the deleterious effects of heat generated by ions when they bombard a mask structure.

Conceptually, these objectives are attained by applying to the mask a quantity of energy at least equal to the heat energy to be generated by the ion beam. When the ion beam is directed against the mask, the applied energy is reduced by an amount substantially equal to the heat generated by the ion beam. This keeps the total quantity of energy applied to the mask substantially constant, thereby maintaining the mask temperature substantially constant and avoiding thermal effects.

In practice, electrical current is directed through the mask to heat it to a predetermined high temperature. Next, as the mask is scanned with the ion beam, the mask resistance is monitored, and the heating current is reduced to maintain a constant mask resistance. Since the resistance of the mask is a function of mask temperature, this has the effect of reducing the heating current by an amount sufficient to compensate for the thermal effect of the ion beam.

These and other objects, features and advantages of the invention will be better understood from a consideration of the following detailed description, taken in conjunction with the accompanying drawing.

DRAWING DESCRIPTION

FIG. 1 is a schematic view of ion implantation apparatus in accordance with an illustrative embodiment of the invention; and FIG. 2 is a view taken along lines 2—2 of FIG. 1.

DETAILED DESCRIPTION

Figure 1:
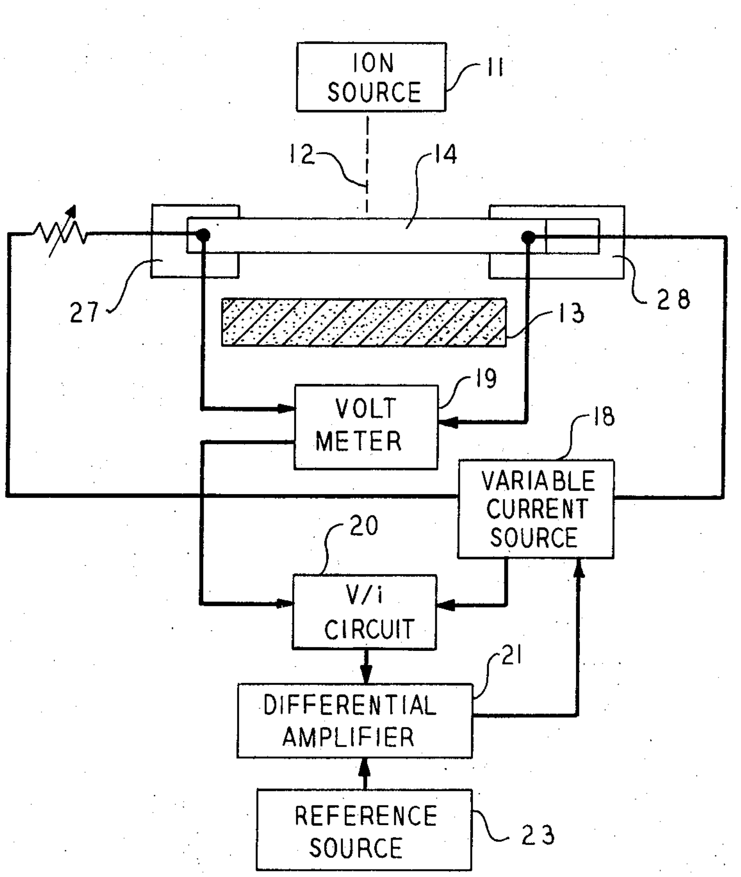
Figure 2:
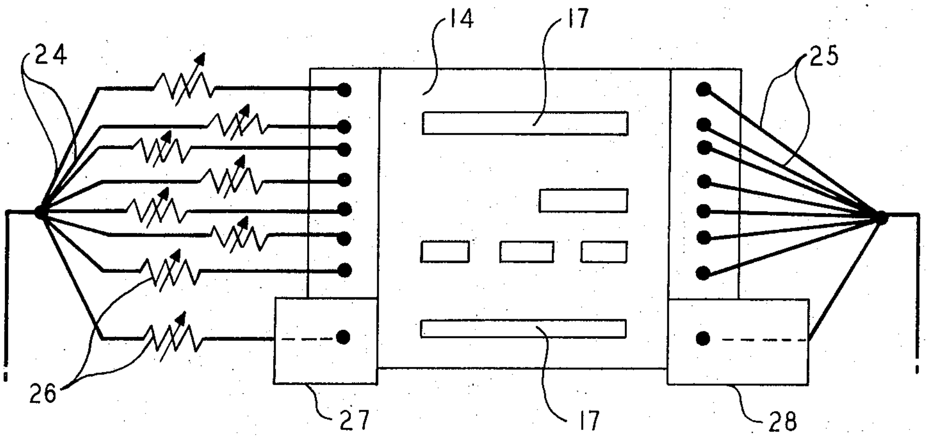

Referring now to FIGS. 1 and 2, there is shown ion implantation apparatus comprising ion source 11 for forming and projecting a beam 12 of impurity ions toward a mask 14 and a semiconductor substrate 13. It is to be understood that ion source 11 includes known apparatus for causing the ion beam 12 to raster scan the mask 14 in a known manner. As the beam scans the mask, it is projected through apertures 17, shown in FIG. 2, to impinge on selective regions of the wafer 13. The impinging ions become implanted in the wafer to change its local conductivity in a manner well understood in the art.

Mask 14 may be made of silicon, in which apertures 17 may be etched with a high degree of precision. Because the ion beam 12 is highly controllable and the trajectories of ions very predictable, and patterns of ion implantation in the substrate may be made with a high degree of resolution and accuracy. I have found, however, that this advantage tends to be limited in conventional ion implantation processes because of the effects of thermal expansion on the mask due to heat generated by impinging ions. That is, unpredictable thermal expansion and contraction of the mask reduces the accuracy with which apertures 17 define regions of ion implantation.

In accordance with the invention, this problem is reduced or eliminated by directing a relatively high heating current through the mask prior to ion scanning, and then reducing the heating current to compensate for the heat generated by the ion beam. Referring to FIG. 1, current is directed through the mask 14 by a variable current source 18. During scanning, the resistance of the mask 14 is monitored, and a servo signal is generated to maintain the resistance at a constant value by controlling the variable current source. Since resistance is a function of temperature, this technique maintains the mask at a substantially constant predetermined temperature, thereby avoiding the variations in location accuracy of the mask apertures that result from temperature changes.

The resistance of the mask may be monitored by using a voltmeter 19 to generate a voltage signal which, along with a current signal from current source 18, is directed to a circuit 20 for measuring the ratio of voltage to current. The output signal of circuit 20 is proportional to mask resistance and is directed to a differential amplifier 21 which compares the resistance signal with that of a reference source 23. In this manner, either increases or decreases in mask resistance from the reference value result in a signal which is directed to the variable current source 18 to control appropriately the current directed through the mask. The current is of course controlled by the servo signal such as to maintain a constant resistance in the mask 14.

The structural components and operation of the various functional devices shown are all well known in the art and do not warrant detailed exposition. For example, the V/i circuit 20 comprises nonlinear devices for generating signals proportional to the logarithm of voltage and current, and simple circuits for subtracting the logarithm current component from the logarithm voltage component to generate a logarithm resistance component. Other apparatus could of course alternatively be used for controlling applied heating current such as to compensate for the heat generated by the ion beam in the mask.

Even with the above technique, temperature gradients can be established in the mask if the heating current through the mask is nonuniform. Such current nonuniformities may be reduced by contacting the mask with a plurality of conductors 24 and 25 as shown in FIG. 2. Merely using a plurality of conductors has the effect of distributing the current in the mask, thereby reducing temperature nonuniformities. In addition, each lead 24 includes a variable resistor 26 for controlling current to achieve even greater uniformity.

Prior to ion beam scanning, heating current is directed through the mask by way of conductors 25 and 26 and is thereby heated to a fairly high temperature. Next, a thermometer device such as a thermocouple is used to measure the local temperature at various locations along a line perpendicular to mask current flow. As the temperature is measured, the variable resistors are adjusted to give a constant temperature at all locations in the mask. Thereafter, the apparatus may be used as shown in FIG. 1 to maintain a constant mask temperature.

As mentioned above, the mask 14 may typically be made of silicon. It may have a thickness of 1 mil, dimensions of 10 cm × 10 cm, and the ion beam may be 100 microamperes at 300 kilovolts. This generates heat of about 30 watts in the mask, which, if dissipated by radiation, can be shown to give a displacement due to thermal expansion of approximately 1 part in a thousand or 100 micrometers. This of course could interfere with the accuracy and resolution with which patterns are defined. In order to compensate for this effect, one should apply 30 watts of heating current power which may be done by applying a current of approximately 6 amps with a voltage drop across the mask of approximately 5 volts.

The substrate 13 is illustratively held in place by a clamp 27 which rigidly secures one corner of the substrate, and a holder 28 in which another corner is slideably mounted. As is known in the art, the mask expands when heated, but because clamp 27 secures only a small area portion, and because the mask is free to slide in holder 28, it does not crack under thermal stress.

A process has been described in detail for increasing the accuracy with which ion implanted patterns may be defined through the application of energy prior to ion bombardment and the subsequent reduction of applied energy to compensate for heat generated by the impinging ions. While a specific technique for applying heating current such as to minimize local temperature readings has been described, it is clear that various alternatives could be used. It is also clear that the invention is applicable to any process in which projected particles are likely to generate heat in a mask through which they are transmitted. In this sense, light and other electromagnetic wave radiation should be considered as constituting projected particles which may generate heat in a mask.

Various other embodiments and modifications may be made by those skilled in the art without departing from the spirit and scope of the invention.

What is claimed is:

1. In a method for forming a pattern on a substrate comprising the step of projecting particles through a mask onto the substrate, whereby particles impinging on the mask generate heat energy within the mask, the improvement comprising:

imparting second energy to the mask prior to said particle projection:

projecting the particles as aforesaid; and reducing the second energy imparted to the mask by an amount substantially equal to said heat energy generated in the mask by the impinging particles.

2. The improvement of claim 1 wherein:

the second energy imparted to the mask is caused by electrical current; and the step of reducing the second energy imparted to the mask comprises the step of reducing said electrical current.

3. The improvement of claim 2 further comprising the step of:

monitoring the electrical resistance of the mask; and controlling the electrical current as a function of said monitored electrical resistance.

4. The improvement of claim 3 wherein:

said substrate is a semiconductor substrate; and the steps of projecting particles through the mask comprises the step of irradiating the mask with ions, some of which are transmitted through openings in the mask to the substrate.

5. The improvement of claim 4 wherein:

the step of transmitting electrical current through the mask comprises the step of transmitting current to a plurality of locations on one side of the mask by a plurality of conductors; and further comprising the step of equalizing the electrical current distribution in the mask by adjusting the relative resistance of said plurality of conductors.

6. In a method for forming a pattern on a substrate comprising the steps of projecting particles through a mask onto the substrate, the improvement comprising the steps of:

directing a heating current through the mask;

monitoring the electrical resistance of the mask; and controlling the heating current as a function of said electrical resistance, thereby to compensate for the heating effects of particles impinging on said mask.

7. The improvement of claim 6 wherein:

the step of projecting particles through the mask comprises the step of raster scanning the mask with a beam of ions, thereby to implant in the substrate ions that are projected through the apertures in the mask.

* * * * *